United States Patent
Shimoyama et al.

(10) Patent No.: US 9,297,088 B2
(45) Date of Patent: Mar. 29, 2016

(54) ELECTROPLATING METHOD AND ELECTROPLATING APPARATUS FOR THROUGH-HOLE

(71) Applicant: EBARA CORPORATION, Tokyo (JP)

(72) Inventors: Masashi Shimoyama, Tokyo (JP); Yuji Araki, Tokyo (JP); Fumio Kuriyama, Tokyo (JP); Jumpei Fujikata, Tokyo (JP)

(73) Assignee: Ebara Corporation, Tokyo (JP)

(*) Notice: Subject to any disclaimer, the term of this patent is extended or adjusted under 35 U.S.C. 154(b) by 312 days.

(21) Appl. No.: 13/959,811

(22) Filed: Aug. 6, 2013

(65) Prior Publication Data

US 2014/0042032 A1    Feb. 13, 2014

(30) Foreign Application Priority Data

Aug. 7, 2012  (JP) .................................. 2012-174694
Jul. 29, 2013  (JP) .................................. 2013-156314

(51) Int. Cl.

| | | |
|---|---|---|
| *C25D 5/18* | (2006.01) | |
| *C25D 5/02* | (2006.01) | |
| *C25D 5/20* | (2006.01) | |
| *C25D 17/18* | (2006.01) | |
| *C25D 21/10* | (2006.01) | |
| *C25D 21/12* | (2006.01) | |
| *H01L 21/768* | (2006.01) | |
| *H01L 21/288* | (2006.01) | |
| *C25D 5/10* | (2006.01) | |
| *C25D 17/00* | (2006.01) | |

(52) U.S. Cl.
CPC .. *C25D 5/18* (2013.01); *C25D 5/02* (2013.01); *C25D 5/10* (2013.01); *C25D 17/001* (2013.01); *C25D 21/10* (2013.01); *C25D 21/12* (2013.01); *H01L 21/2885* (2013.01); *H01L 21/76898* (2013.01)

(58) Field of Classification Search
CPC ............ C25D 5/08; C25D 5/18; C25D 7/123; H01L 21/2885; H01L 21/76898
See application file for complete search history.

(56) References Cited

U.S. PATENT DOCUMENTS

| | | | |
|---|---|---|---|
| 7,909,976 B2 * | 3/2011 | Mashino ........................ | 205/104 |
| 2003/0010642 A1 * | 1/2003 | Taylor et al. ................... | 205/103 |
| 2010/0006444 A1 * | 1/2010 | Endo et al. ...................... | 205/89 |
| 2012/0160696 A1 * | 6/2012 | Araki et al. .................... | 205/171 |

FOREIGN PATENT DOCUMENTS

| | | |
|---|---|---|
| JP | 2005-93934 A | 4/2005 |
| JP | 2006-188745 A | 7/2006 |
| WO | 2006/032346 A1 | 3/2006 |

* cited by examiner

*Primary Examiner* — Luan Van
*Assistant Examiner* — Louis Rufo
(74) *Attorney, Agent, or Firm* — Baker & Hostetler LLP

(57) ABSTRACT

There is provided an electroplating method for a through-hole. The method includes: a first plating process, a second plating process, and a third plating process. The first plating process is a plating process of forming a metal film with a uniform thickness in the through-hole to reduce a diameter of the through-hole, the second plating process is a plating process of blocking up a central portion of the through-hole with the metal film using a PR pulsed current, and the third plating process is a plating process of completely filling the through-hole with the metal film using the plating current whose value is equal to or larger than a forward-current value of the PR pulsed current used in the second plating process.

11 Claims, 17 Drawing Sheets

ELECTROPLATING METHOD AND ELECTROPLATING APPARATUS FOR THROUGH-HOLE

CROSS REFERENCE TO RELATED APPLICATIONS

This document claims priorities to Japanese Patent Application Number 2012-174694, filed Aug. 7, 2012 and Japanese Patent Application Number 2013-156314, filed Jul. 29, 2013, the entire contents of which are hereby incorporated by reference.

BACKGROUND OF THE INVENTION

1. Field of the Invention

The present invention relates to an electroplating method for simultaneously plating both a front surface and a back surface of a substrate which has a through-hole vertically penetrating in its interior to fill the through-hole with a metal film, i.e., metal such as copper.

2. Description of the Related Art

A technique of forming a plurality of through-vias of a metal, vertically penetrating through a substrate, is known as a method of electrically connecting layers of a multi-layer stack of substrates, such as semiconductor substrates. It is customary to make vertical through-vias in a substrate by simultaneously plating both a front surface and a back surface of the substrate, which has through-holes vertically penetrating in its interior, to thereby fill the through-holes with a metal film.

As shown in FIG. 1A, a substrate W is prepared which includes a base material 100 having a vertical through-hole 100a defined therein, and a barrier layer 102 made of Ti or the like and a seed layer 104, as an electric feeding layer, which cover an entire surface of the base material 100 including an inner surface of the through-hole 100a. The front surface and the back surface of the substrate W are simultaneously plated to deposit a metal film 106 of copper or the like on the front surface and the back surface of the substrate W and in the through-hole 100a, as shown in FIG. 1B. The metal film 106 in the through-hole 100a has its maximum thickness at a central portion of the through-hole 100a with respect to an in-depth direction (i.e., a longitudinal direction) thereof. Then, as shown in FIG. 1C, the metal film 106 is grown until tip ends of layers of the metal film 106 that have grown from the surface of the through-hole 100a are joined to each other at the central portion of the through-hole 100a. The central portion of the through-hole 100a is thus blocked up by the metal film 106, forming recesses 108 above and below the blocked portion. The plating process is further continued to grow the metal film 106 in the recesses 108 until the recesses 108 are filled up with the metal film 106, as shown in FIG. 1D. In this manner, a through-via made up of the metal film 106 or copper or the like is produced in the substrate W (see Japanese Laid-Open Patent Publication No. 2005-93934).

There has been proposed an electroplating method for filling through-holes defined in a substrate with a metal i.e., a metal film (see Japanese Laid-Open Patent Publication No. 2006-188745). According to this electroplating method, a PR pulsed current, which has a forward current and a reverse current flowing in an opposite direction to the forward current, is supplied to flow between a substrate as a cathode and an anode to fully or substantially fully fill the central portion of the through-hole with the metal.

There has also been proposed a method for preventing whiskers from being produced when plating a printed wiring substrate or the like with copper (see Japanese Laid-Open Patent Publication No. 2008-513985). This method includes the steps of performing a typical forward electrolysis with use of a forward pulsed current using a substrate as a cathode and a reverse electrolysis with use of a reverse pulsed current using the substrate as an anode. The forward electrolysis and the reverse electrolysis are switched alternately during plating of the substrate. Further, during this plating process, a ratio of a duration of the forward pulsed current to a duration of the reverse pulsed current, or a ratio of a density of the forward pulsed current to a density of the reverse pulsed current is changed.

In the case where the through-hole 100a shown in FIG. 1A has a diameter d in a range of 100 μm to 150 μm, the conventional electroplating method can fill the through-hole 100a with the metal film effectively. However, if the through-hole 100a shown in FIG. 1A has a diameter d of as relatively large as 150 μm to 300 μm, it takes a considerable time to block up its central portion with respect to a depth direction (i.e., a longitudinal direction) of the through-hole 100a. More specifically, as shown in FIG. 1C, it takes a considerable time until the surface layers of the metal film 106, growing from the surface of the through-hole 100a, join to each other. Moreover, as shown in FIG. 1D, a void may be produced in the metal film 106 when the metal film 106 further grows in the recesses 108 to fill the recesses 108. Further, if the diameter d of the through-hole 100a is as relatively small as 30 μm to 100 μm, the opening portions of the through-hole 100a may be closed with the metal film 106 before the central portion of the through-hole 100a is blocked up, and as a result, the void may be formed in the metal film 106.

SUMMARY OF THE INVENTION

The present invention has been made in view of the above circumstances. It is therefore an object of the present invention to provide an electroplating method and an electroplating apparatus for a through-hole capable of securely filling the through-hole with a metal film with no void therein in a shorter period of time even if the through-hole has a diameter of as relatively large as 150 μm to 300 μm.

Further, it is an object of the present invention to provide an electroplating method and an electroplating apparatus for a through-hole capable of securely filling the through-hole with a metal film with no void therein by controlling conditions of a pulsed current, even if the through-hole has a diameter of as relatively small as 30 μm to 100 μm.

One aspect of the present invention is an electroplating method for a through-hole. The method includes: immersing a substrate having a through-hole into a plating solution; and supplying a plating current between the substrate and anodes to perform a first plating process, a second plating process, and a third plating process successively, the anodes being arranged so as to face a front surface and a back surface of the substrate, wherein the first plating process is a plating process of forming a metal film with a uniform thickness in the through-hole to reduce a diameter of the through-hole, the second plating process is a plating process of blocking up a central portion of the through-hole with the metal film using a PR pulsed current constituted by a forward current used in metal deposition and a reverse current used in metal dissolution which are generated alternately, a forward-current value of the PR pulsed current is smaller than a value of the plating current used in metal deposition in the first plating process, and the third plating process is a plating process of completely filling the through-hole with the metal film using the plating current whose value is equal to or larger than the forward-current value of the PR pulsed current used in the second plating process.

According the invention as described above, the first plating process is performed to form the metal film in the through-hole so as to reduce the diameter of the through-hole, and the second plating process is then performed to block up or close up the central portion of the through-hole with the metal film formed in the through-hole. Accordingly, even if the through-hole has a relatively large diameter, it is possible to reduce a time required to block up the central portion of the through-hole with the metal film. Further, the third plating process is performed to complete filling of the through-hole with the metal film with no void therein.

In a preferred aspect of the present invention, the plating current used in the first plating process is a PR pulsed current constituted by a forward current used in metal deposition and a reverse current used in metal dissolution which are generated alternately.

The use of the PR pulsed current in the first plating process makes it possible to form the metal film with a more uniform thickness in the through-hole including the opening portions thereof and a field area of the substrate, as compared with the case where the first plating process is performed with use of a direct current which equalizes a deposition speed (or deposition rate) of the metal.

In a preferred aspect of the present invention, a reverse-current duration of the PR pulsed current used in the second plating process is longer than a reverse-current duration of the PR pulsed current used in the first plating process.

With this method, it is possible to prevent the formation of the void in the metal film formed in the second plating process.

In a preferred aspect of the present invention, the plating current used in the third plating process is a PR pulsed current constituted by a forward current used in metal deposition and a reverse current used in metal dissolution which are generated alternately, and a forward-current value of the PR pulsed current used in the third plating process is equal to or larger than the forward-current value of the PR pulsed current used in the second plating process.

In a preferred aspect of the present invention, a ratio of a forward-current duration to a reverse-current duration of the PR pulsed current used in the second plating process is larger than 75 and smaller than 120.

In a preferred aspect of the present invention, a reverse-current duration of the PR pulsed current used in the second plating process is longer than 0.5 milliseconds and shorter than 10 milliseconds.

In a preferred aspect of the present invention, if the through-hole has a diameter in a range of 30 µm to 100 µm, the second plating process is performed using the PR pulsed current whose ratio of a reverse-current value to the forward-current value is larger than 15 and smaller than 50.

In a preferred aspect of the present invention, the plating current used in the third plating process is a PR pulsed current constituted by a forward current used in metal deposition and a reverse current used in metal dissolution which are generated alternately, and a ratio of a reverse-current value to a forward-current value of the PR pulsed current used in the third plating process is larger than 4 and smaller than 15.

In a preferred aspect of the present invention, the plating current used in the third plating process is a PR pulsed current constituted by a forward current used in metal deposition and a reverse current used in metal dissolution which are generated alternately, and a ratio of a reverse-current value to a forward-current value of the PR pulsed current used in the third plating process is larger than 15 and smaller than 50.

In a preferred aspect of the present invention, the reverse-current value of the PR pulsed current used in the third plating process is smaller than a reverse-current value of the PR pulsed current used in the second plating process.

In a preferred aspect of the present invention, the method further includes during the first plating process, the second plating process, and the third plating process, agitating the plating solution by oscillating paddles at a maximum linear velocity in a range of 1.3 m/sec to 2.6 m/sec, one of the paddles being arranged between the substrate and one of the anodes and the other of the paddles being arranged between the substrate and the other of the anodes.

Another aspect of the present invention is an electroplating apparatus for a through-hole. The apparatus includes: a plating bath configured to store a plating solution therein; a substrate holder configured to hold a substrate having a through-hole with a front surface and a back surface of the substrate exposed and configured to immerse the substrate into the plating solution in the plating bath; a pair of anodes disposed so as to face the front surface and the back surface of the substrate immersed in the plating solution; a plating power supply capable of changing a flow direction of a plating current and changing a value of the plating current and configured to supply the plating current between the substrate and the anodes; and a controller configured to control the plating power supply so as to perform a first plating process, a second plating process, and a third plating process successively, the first plating process being a plating process of forming a metal film with a uniform thickness in the through-hole to reduce a diameter of the through-hole, the second plating process being a plating process of blocking up a central portion of the through-hole with the metal film using a PR pulsed current constituted by a forward current used in metal deposition and a reverse current used in metal dissolution which are generated alternately, a forward-current value of the PR pulsed current being smaller than a value of the plating current used in metal deposition in the first plating process, and the third plating process being a plating process of completely filling the through-hole with the metal film using the plating current whose value is equal to or larger than the forward-current value of the PR pulsed current used in the second plating process.

According to the electroplating method, it is possible to securely fill the through-hole with the metal film with no void therein in a shorter period of time even if the through-hole has a relatively large diameter.

DESCRIPTION OF THE PREFERRED EMBODIMENTS

Preferred embodiments of the present invention will now be described with reference to the drawings. The following descriptions includes an embodiment in which a metal film of copper (e.g., a copper film) is used to fill a through-hole, but it is noted that the metal film for filling the through-hole is not limited to the copper film.

Figure 1A:
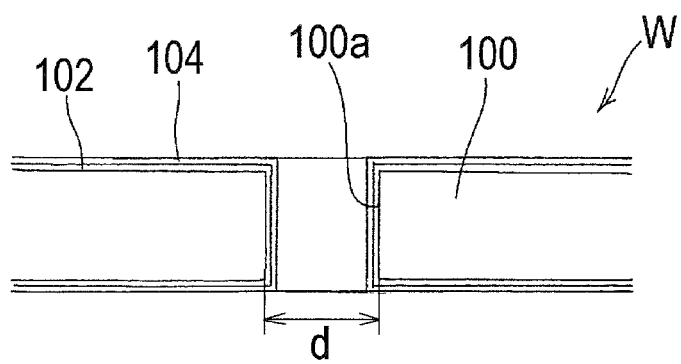
FIGS. 1A through 1D are diagrams illustrating, in a sequence of process steps for filling a metal film into a through-hole defined in a substrate to form a through-via.
Figure 1B:
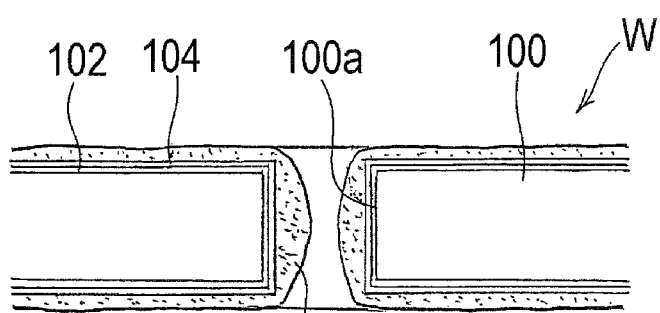
Figure 1C:
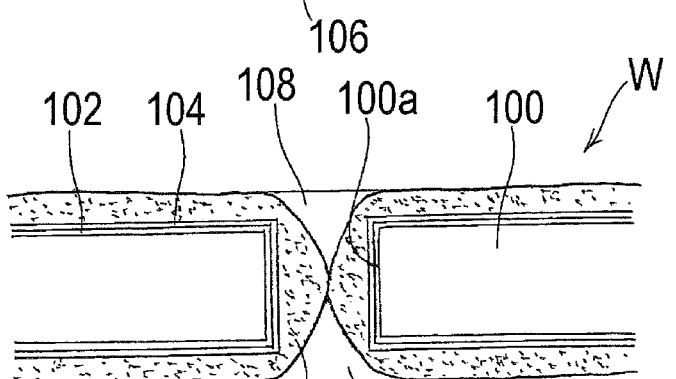
Figure 1D:
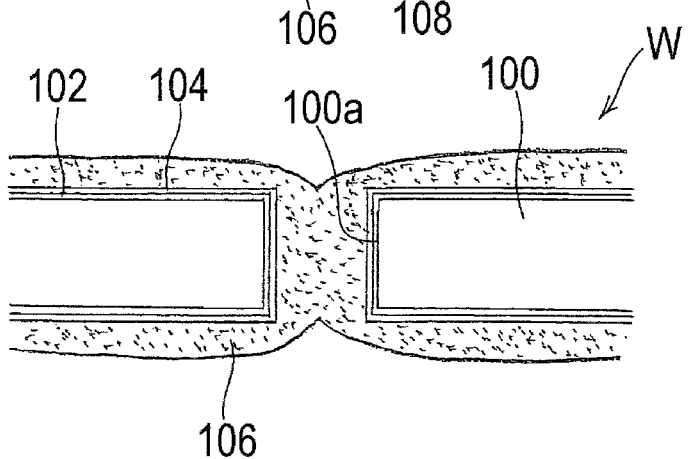
Figure 2:
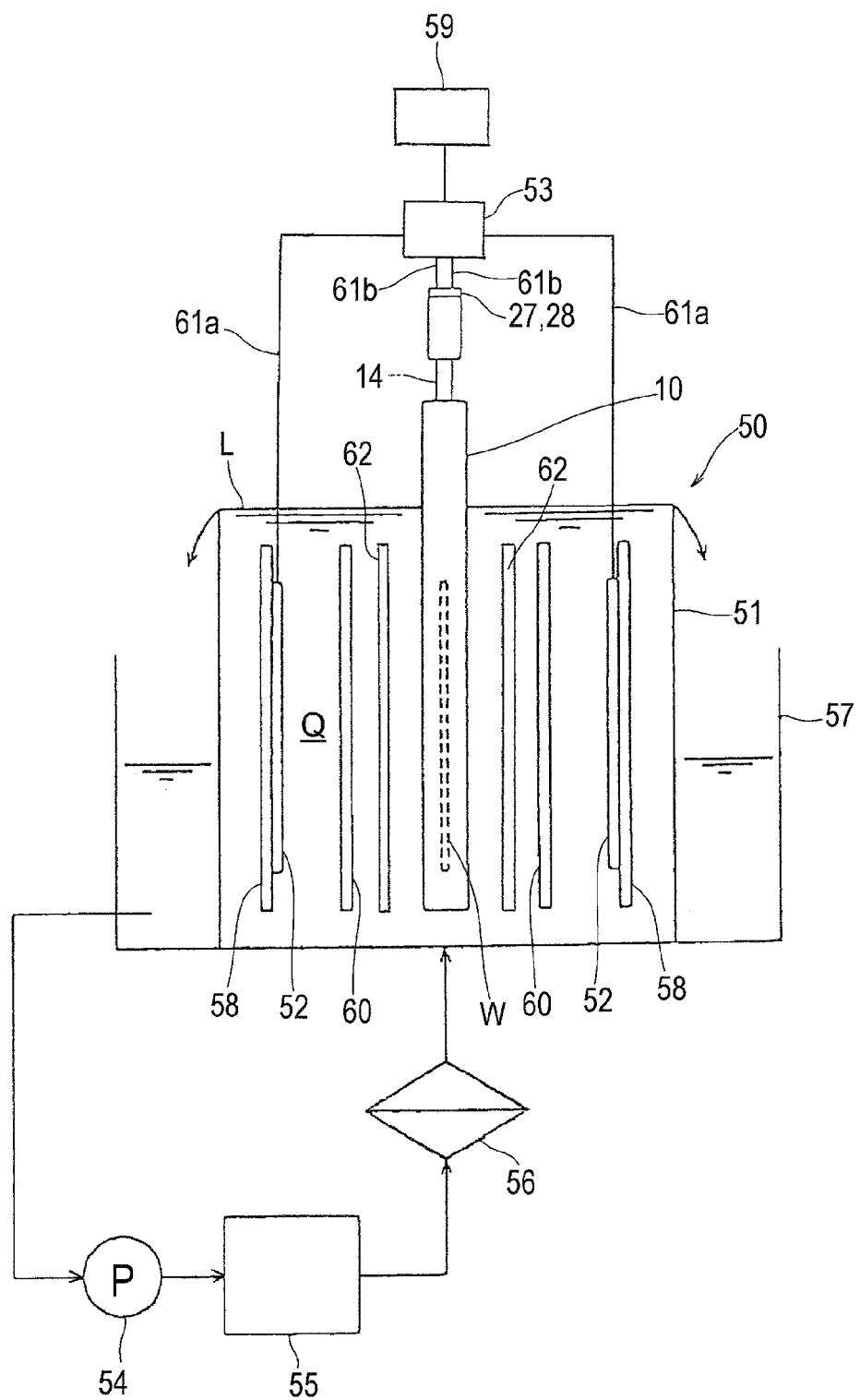
FIG. 2 is a vertical sectional front view schematically showing an embodiment of an electroplating apparatus according to the present invention.

FIG. 2 is a vertical sectional front view schematically showing an embodiment of an electroplating apparatus 50 according to the present invention. As shown in FIG. 2, the electroplating apparatus 50 includes a plating bath 51 storing a plating solution Q therein, and a substrate holder 10 holding a substrate W, such as a printed substrate, and suspended vertically in the plating solution Q. The plating solution Q with the substrate holder 10 immersed therein has a surface level L at an upper end of the plating bath 51, as shown in FIG. 2. A pair of insoluble anodes 52, supported by respective anode holders 58, are disposed in the plating bath 51 in facing relation to exposed surfaces, i.e., a front surface and a back surface, of the substrate W held by the substrate holder 10. The substrate holder 10 includes a first holding member 11 having a circular hole 11a defined therein and a second holding member 12 having a circular hole 12a defined therein. The first holding member 11 and the second holding member 12 are configured to hold the substrate W therebetween. The insoluble anodes 52 are circular in shape and substantially identical in size to the circular holes 11a and 12a of the first and second holding members 11 and 12.

Two regulation plates 60 made of an insulating material are disposed between the substrate W and the respective insoluble anodes 52 in the plating bath 51. The regulation plates 60 have respective circular holes defined in their center which are similar in shape and size to the circular holes 11a and 12a of the first and second holding members 11 and 12. The hole of each regulation plate 60 is preferably smaller than a surface, to be plated, of the substrate W. The insoluble anodes 52 are electrically connected to wires 61a, respectively, extending from a plating power supply 53, which is capable of changing a flow direction of a plating current and also changing a value of the plating current. Wires 61b, extending from the plating power supply 53, are electrically connected respectively to terminal plates 27 and 28 of the substrate holder 10. These wires 61b may have the same length. The plating power supply 53 is further electrically connected to a controller 59 which controls the plating power supply 53.

Paddles 62 for agitating the plating solution Q are disposed between the substrate W held by the substrate holder 10 and the regulation plates 60 disposed in the plating bath 51. The paddles 62 are configured to oscillate parallel to the substrate W held by the substrate holder 10 for stirring the plating solution Q. The electroplating apparatus 50 further includes an outer bath 57 disposed outwardly of the plating bath 51 for receiving the plating solution Q which has overflowed the plating bath 51. The plating solution Q, which has overflowed the plating bath 51 into the outer bath 57, is passed through a constant-temperature unit 55 and a filter 56 back into the plating bath 51 from its bottom by a plating solution circulation pump 54. In this manner, the plating solution Q circulates through the plating bath 51, the outer bath 57, the constant-temperature unit 55, and the filter 56 in this order.

Figure 3:
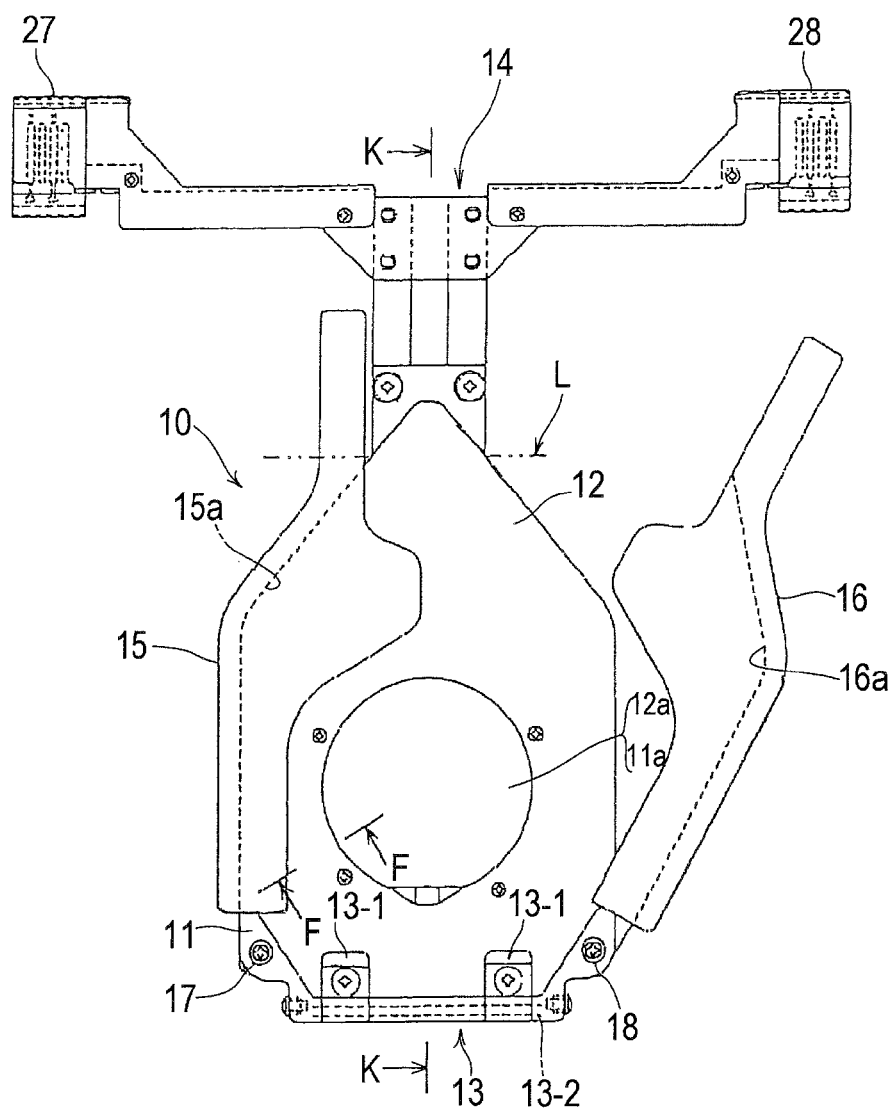
FIG. 3 is a front view of a substrate holder of the electroplating apparatus shown in FIG. 2.
Figure 4:
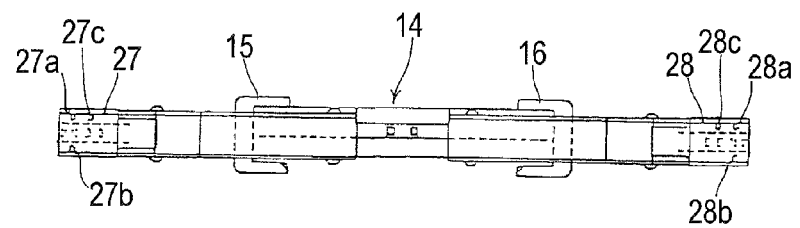
FIG. 4 is a plan view of the substrate holder of the electroplating apparatus shown in FIG. 2.
Figure 5:
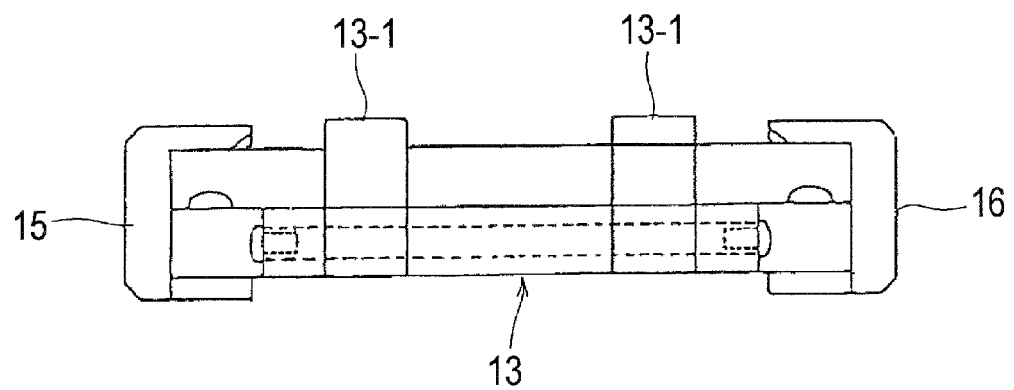
FIG. 5 is a bottom view of the substrate holder of the electroplating apparatus shown in FIG. 2.
Figure 6:
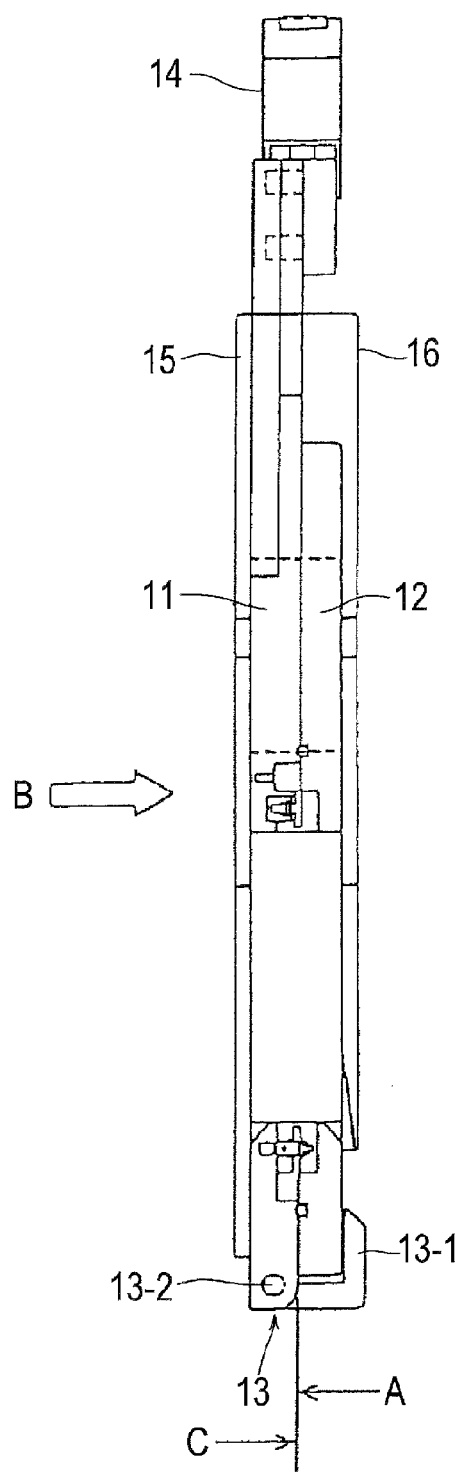
FIG. 6 is a cross-sectional view taken along line K-K of FIG. 3.
Figure 7:
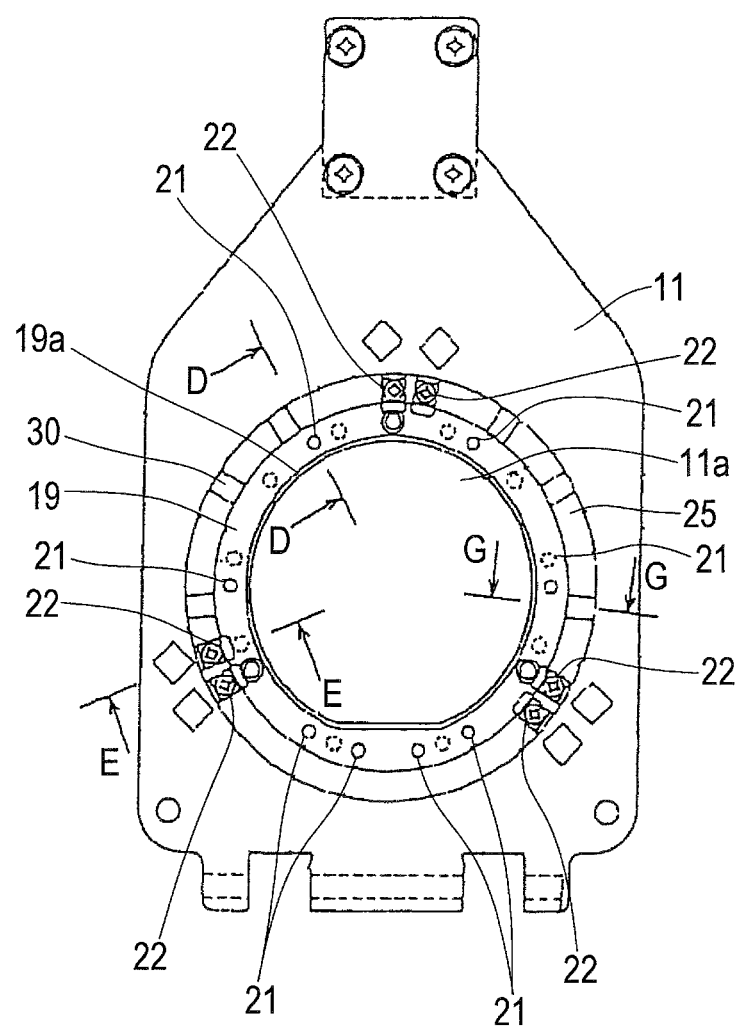
FIG. 7 is a view of the substrate holder as viewed along arrow A in FIG. 6.
Figure 8:
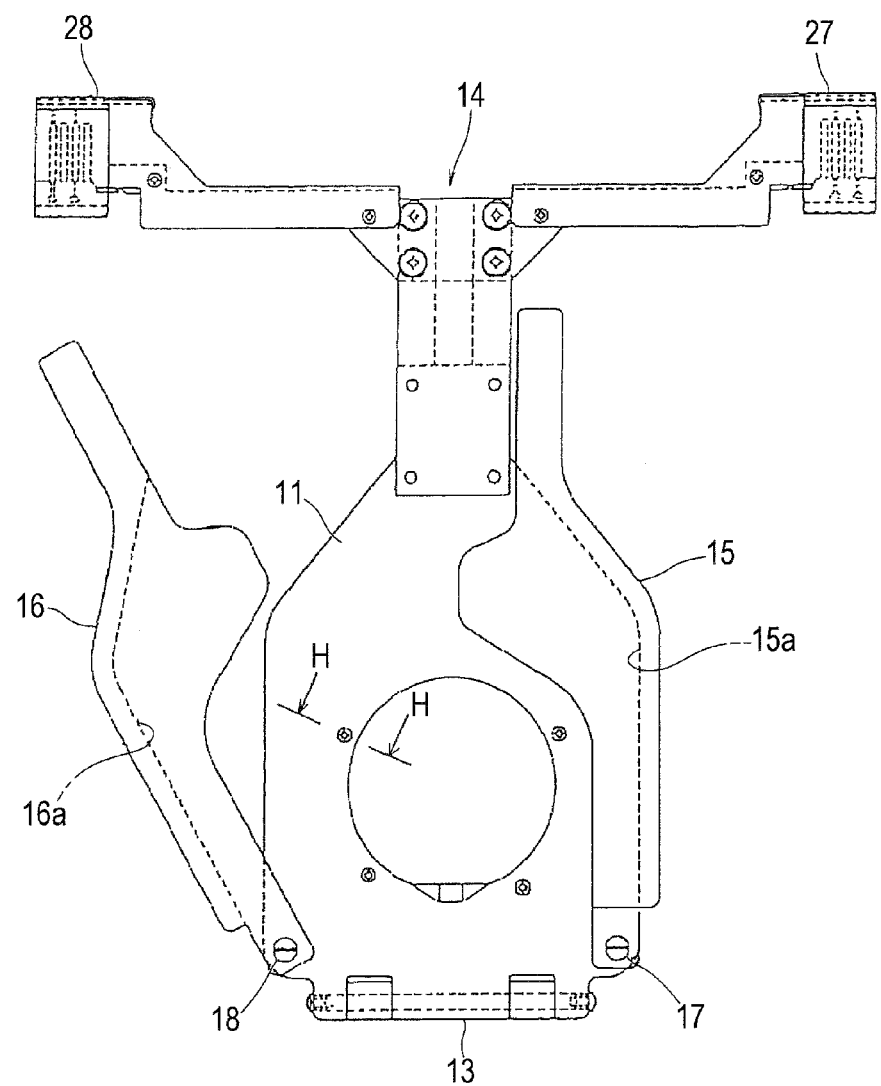
FIG. 8 is a view of the substrate holder as viewed along arrow B in FIG. 6.
Figure 9:
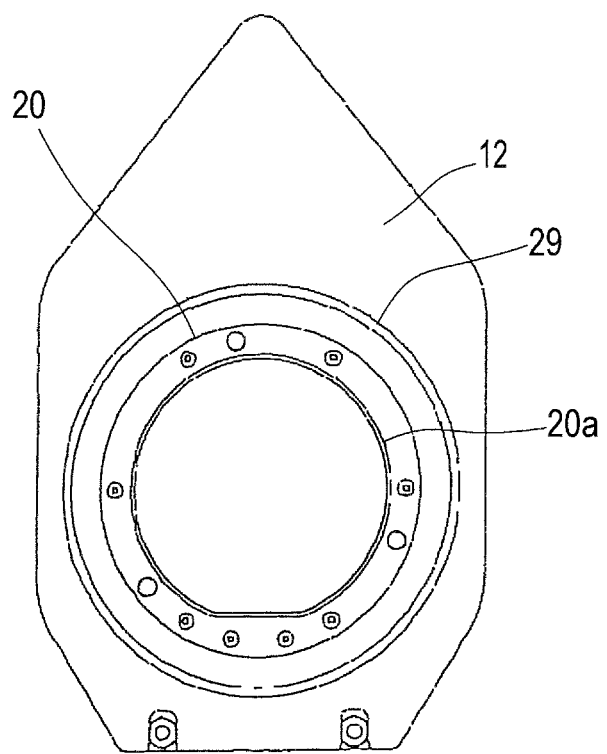
FIG. 9 is a view of the substrate holder as viewed along arrow C in FIG. 6.
Figure 10:
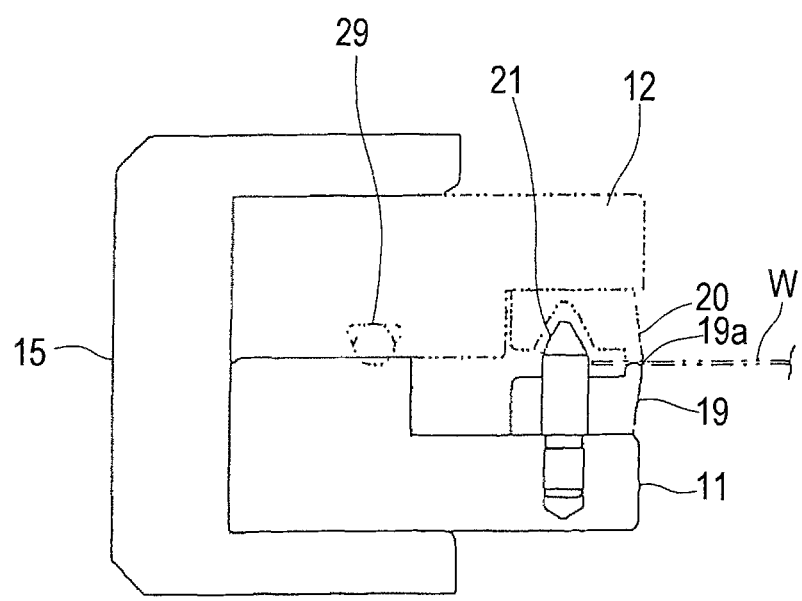
FIG. 10 is a cross-sectional view taken along line D-D of FIG. 7.
Figure 11:
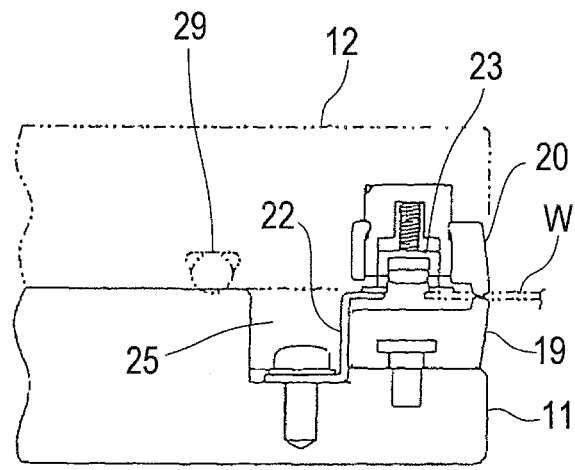
FIG. 11 is a cross-sectional view taken along line E-E of FIG. 7.
Figure 12:
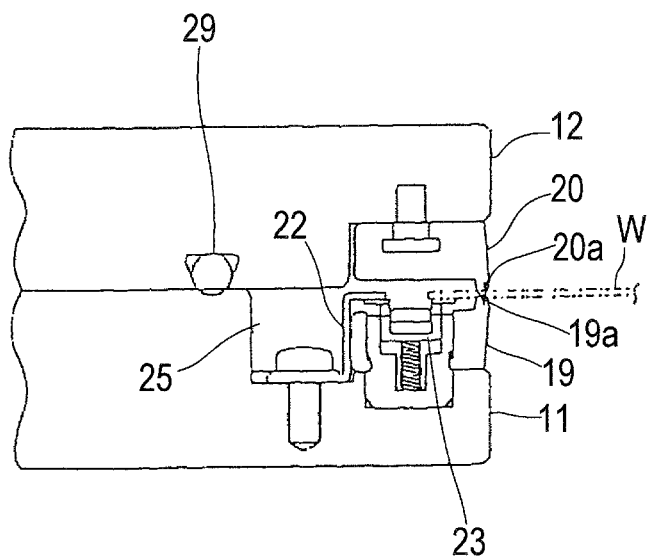
FIG. 12 is a cross-sectional view taken along line F-F of FIG. 3.
Figure 13:
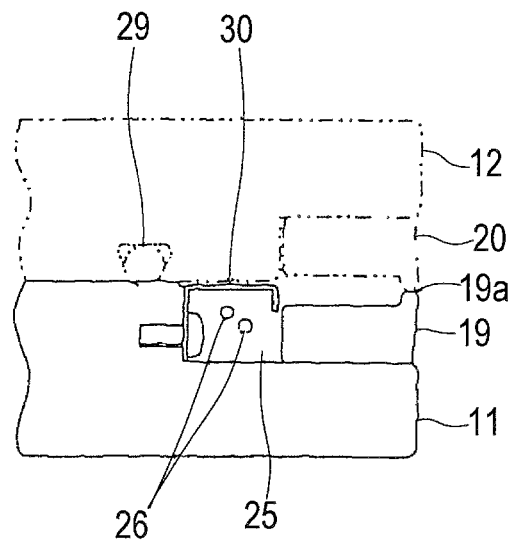
FIG. 13 is a cross-sectional view taken along line G-G of FIG. 7.
Figure 14:
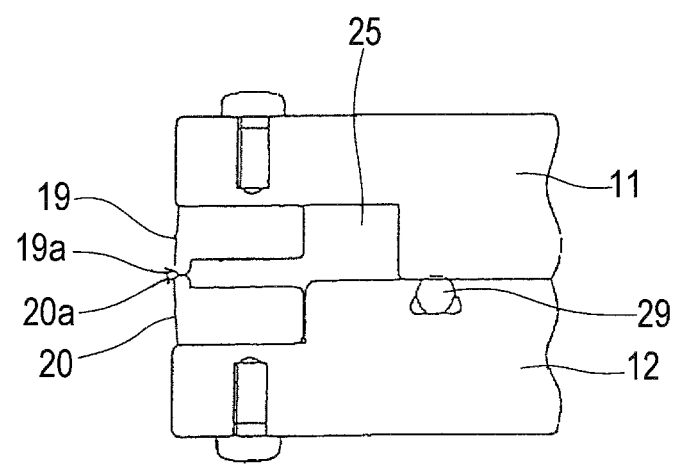
FIG. 14 is a cross-sectional view taken along line H-H of FIG. 8.

FIG. 3 is a front view of a substrate holder 10. FIG. 4 is a plan view of the substrate holder 10. FIG. 5 is a bottom view of the substrate holder 10. FIG. 6 is a cross-sectional view taken along line K-K of FIG. 3. FIG. 7 is a view of the substrate holder 10 as viewed along arrow A in FIG. 6. FIG. 8 is a view of the substrate holder 10 as viewed along arrow B in FIG. 6. FIG. 9 is a view of the substrate holder 10 as viewed along arrow C in FIG. 6. FIG. 10 is a cross-sectional view taken along line D-D of FIG. 7. FIG. 11 is a cross-sectional view taken along line E-E of FIG. 7. FIG. 12 is a cross-sectional view taken along line F-F of FIG. 3. FIG. 13 is a cross-sectional view taken along line G-G of FIG. 7. FIG. 14 is a cross-sectional view taken along line H-H of FIG. 8.

As shown in FIG. 3, the first holding member 11 and the second holding member 12, each of a planar shape, of the substrate holder 10 have respective lower ends pivotally coupled to each other by a hinge mechanism 13. The hinge mechanism 13 has two hooks 13-1 of synthetic resin, e.g., HTPVC, which are fixed to the second holding member 12. The hooks 13-1 are rotatably supported on a lower end of the first holding member 11 by a hook pin 13-2 made of stainless steel, e.g., SUS 303. The first holding member 11 is made of synthetic resin, e.g., HTPVC, and has an approximately pentagonal shape. The circular hole 11a as an opening is centrally defined in the first holding member 11. A T-shaped hanger 14 made of synthetic resin, e.g., HTPVC, is formed integrally with an upper end of the first holding member 11. The second holding member 12 is made of synthetic resin, e.g., HTPVC, and has an approximately pentagonal shape. The circular hole 12a as an opening is centrally defined in the second holding member 12.

When the first holding member 11 and the second holding member 12 are rotated about the hinge mechanism 13 into superposed relation to each other, i.e., when the substrate holder 10 is closed, the first holding member 11 and the second holding member 12 are held together by left and right clamps 15 and 16. The left and right clamps 15 and 16, each made of synthetic resin, e.g., HTPVC, have respective groove 15a and 16a for receiving therein side marginal edges of the first holding member 11 and the second holding member 12 that are superposed one on the other. The left and right clamps 15 and 16 have lower ends rotatably supported on the lower ends of the first holding member 11 through respective pins 17 and 18.

As shown in FIG. 7, a seal ring 19 is mounted to a surface of the first holding member 11 which faces the second holding member 12. This seal ring 19 is arranged around the hole 11a. As shown in FIG. 9, a seal ring 20 is mounted to a surface of the second holding member 12 which faces the first holding member 11. This seal ring 20 is arranged around the hole 12a. The seal rings 19 and 20 are made of rubber, e.g., silicone rubber. An O-ring 29 is mounted to the surface of the second holding member 12 which faces the first holding member 11. This O-ring 29 is arranged around the seal ring 20.

The seal rings 19 and 20, each of a rectangular cross-sectional shape, have respective ridges 19a and 20a extending along inner circumferential edges thereof. When the first holding member 11 and the second holding member 12 are superposed one on the other with the substrate W interposed therebetween, the ridges 19a and 20a press the both surfaces of the substrate W to establish a tight contact with the substrate W, thus forming a liquid-tight space where the plating solution Q does not enter. This space is defined by the O-ring 29 and the ridges 19a and 20a that are located radially outwardly of the holes 11a and 12a. As shown in FIGS. 7 and 10, eight substrate guide pins 21 for positioning the substrate W are mounted to the surface of the first holding member 11 which faces the second holding member 12. These substrate guide pins 21 are arranged radially outwardly of the hole 11a, and project through the seal ring 19.

As shown in FIGS. 7, 11, and 12, six conductive plates 22 are mounted to the surface of the first holding member 11 around the hole 11a. As shown in FIG. 11, three out of the six conductive plates 22 are held in electric connection with a seed layer 104 (see FIGS. 1A through 1D) on one of the surfaces, e.g., the front surface, of the substrate W through conductive pins 23. As shown in FIG. 12, the other three conductive plates 22 are held in electric connection with a seed layer 104 (see FIGS. 1A through 1D) on the other surface, e.g., the back surface, of the substrate W through conductive pins 23.

The three conductive plates 22 which are held in electric connection with the seed layer 104 on one of the surfaces, e.g., the front surface, of the substrate W are electrically connected to electrode terminals 27a, 27b, and 27c (see FIG. 4), respectively, which are provided on the terminal plate 27 of the hanger 14, through insulative covered wires 26 extending in a wire slot 25 (see FIG. 4). The other three conductive plates 22 which are held in electric connection with the seed layer 104 on the other surface, e.g., the back surface, of the substrate W are electrically connected to electrode terminals 28a, 28b, and 28c (see FIG. 4), respectively, which are provided on the other terminal plate 28 of the hanger 14, through insulative covered wires 26 extending in a wire slot 25 (see FIG. 4). The insulative covered wires 26 that connect the conductive plates 22 to the electrode terminals 27a-27c and 28a-28c may preferably have the same length. As shown in FIGS. 7 and 13, the insulative covered wires 26 are fixed in position by wire holders 30 made of a synthetic resin, e.g., PVC.

The substrate holder 10 operates as follows. When the first holding member 11 and the second holding member 12 are rotated about the hinge mechanism 13 in a direction away from each other, i.e., when the substrate holder 10 is opened, the substrate W is placed in an area which is surrounded by the eight substrate guide pins 21 provided on the first holding member 11. The substrate W is thus positioned in place on the first holding member 11. The first holding member 11 and the second holding member 12 are then rotated about the hinge mechanism 13 nearer to each other, i.e., the substrate holder 10 is closed. The left and right clamps 15 and 16 are then angularly moved about the pins 17 and 18 until the side marginal edges of the first holding member 11 and the second holding member 12 are inserted into the respective grooves 15a and 16a of the left and right clamps 15 and 16. The substrate W, which is positioned in place on the first holding member 11, is thus held between the first holding member 11 and the second holding member 12.

The O-ring 29 and the ridges 19a and 20a of the seal rings 19 and 20 jointly form the liquid-tight space where the plating solution Q does not enter. Simultaneously, a circumferential edge area of the substrate W, which is located radially outwardly of the ridges 19a and 20a, is located in the liquid-tight space. Areas of the both surfaces of the substrate W, which are coextensive with the holes 11a and 12a of the first holding member 11 and the second holding member 12, are exposed through the holes 11a and 12a. The three of the six conductive plates 22, which are held in electric connection with the electric feeding layer on one of the surfaces of the substrate W, are electrically connected to the electrode terminals 27a, 27b, and 27c provided on the terminal plate 27 of the hanger 14, and the other three conductive plates 22, which are held in electric connection with the electric feeding layer on the other surface of the substrate W, are electrically connected to the electrode terminals 28a, 28b, and 28c provided on the terminal plate 28 of the hanger 14.

Figure 15:
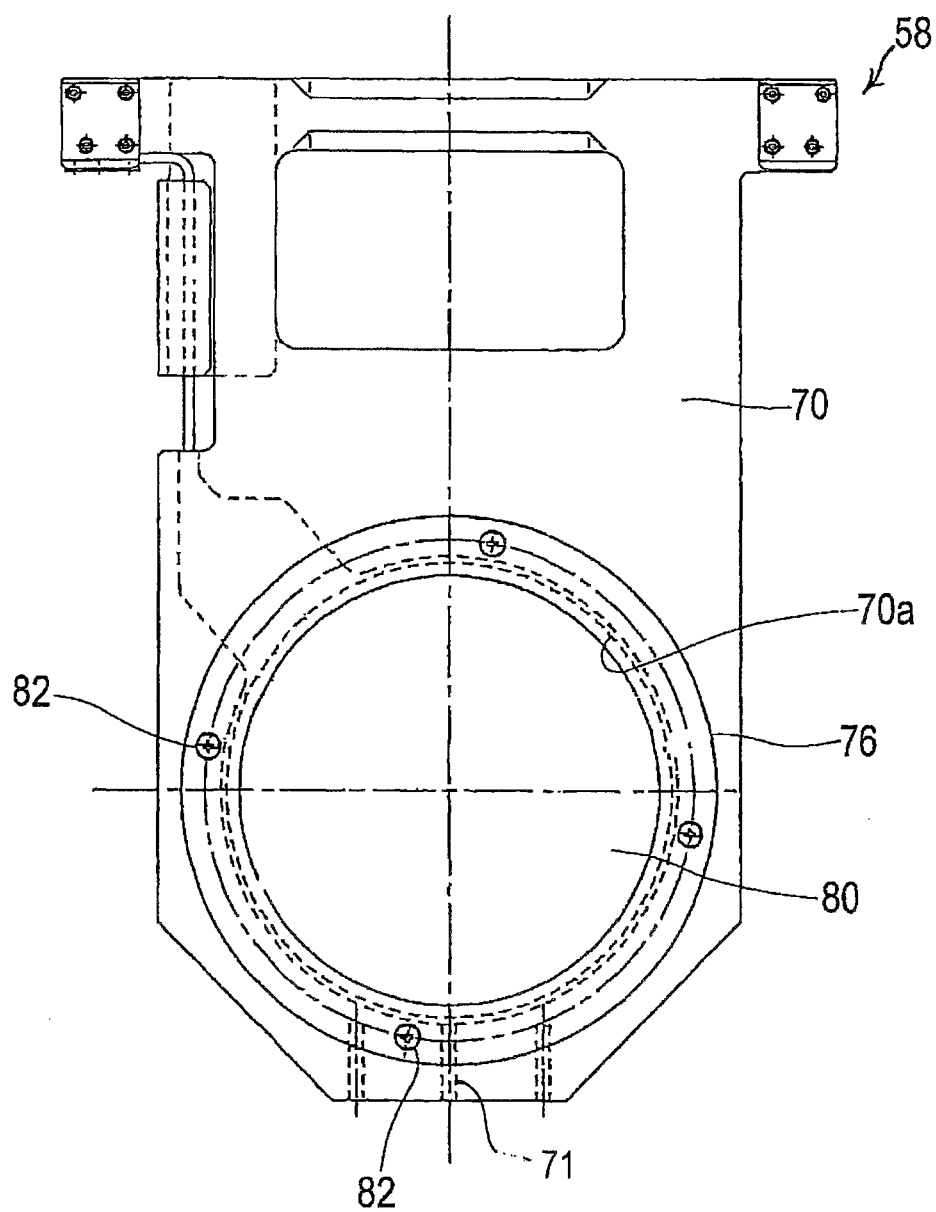
FIG. 15 is a front view of an anode holder, which is holding an insoluble anode thereon, of the electroplating apparatus shown in FIG. 2.
Figure 16:
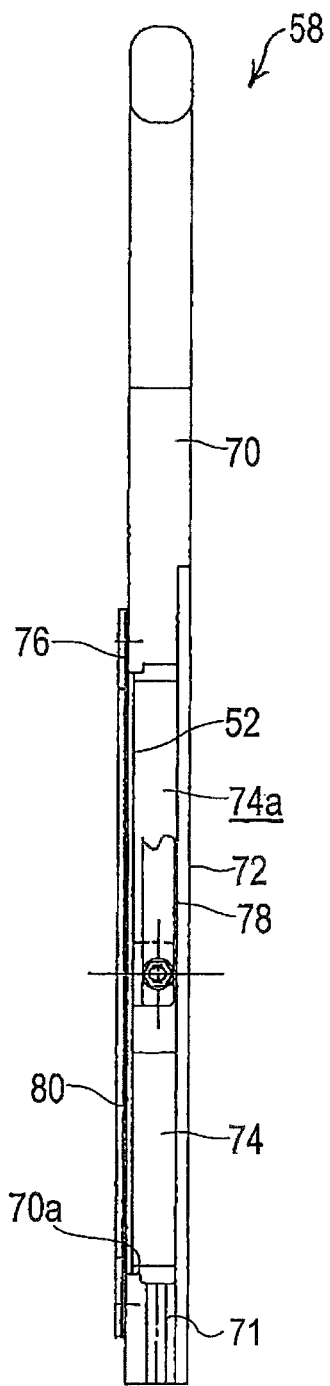
FIG. 16 is a cross-sectional view of the anode holder, which is holding the insoluble anode thereon, of the electroplating apparatus shown in FIG. 2.

FIG. 15 is a front view of the anode holder 58, which is holding the insoluble anode 52 thereon, of the electroplating apparatus shown in FIG. 2, and FIG. 16 is a cross-sectional view of FIG. 15. In this embodiment, in order to prevent anodes from being dissolved by an additive(s) in the plating solution, the insoluble anodes 52, each of which comprises a titanium material coated with iridium oxide, for example, are used.

As shown in FIGS. 15 and 16, each of the anode holders 58 includes a holder body 70 having a central hole 70a defined therein, a closure plate 72 disposed on a reverse side of the holder body 70 for closing the central hole 70a, a circular support plate 74 disposed in the central hole 70a of the holder body 70 and holding the insoluble anode 52 on its surface such that the insoluble anode 52 is located in the central hole 70a, and an annular anode mask 76 mounted to a face side of the holder body 70 in surrounding relation to the central hole 70a. The support plate 74 has a channel 74a defined therein which houses a conductive plate 78 therein which is electrically connected to the wire 61a extending from the plating power supply 53. The conductive plate 78 extends to a central area of the support plate 74 where the conductive plate 78 is electrically connected to the insoluble anode 52.

A diaphragm 80 in the form of an ion exchange membrane or a neutral membrane is disposed so as to cover the surface of the insoluble anode 52 that is located in the central hole 70a of the holder body 70. The diaphragm 80 has its peripheral edge gripped by the holder body 70 and the anode mask 76, and is secured to the holder body 70. The anode mask 76 is secured to the holder body 70 by screws 82, and the closure plate 72 is also secured to the holder body 70 by screws.

When the anode holder 58 is immersed in the plating solution Q, the plating solution Q flows through a drain hole 71 into a gap between the insoluble anode 52 and the support plate 74 located in the central hole 70*a* of the holder body 70.

The insoluble anode 52 and the diaphragm 80 are used for the following reasons. An additive, which is added to the plating solution Q, includes a component for accelerating formation of monovalent copper, which impairs the function of other additives because it causes oxidative decomposition of the other additives. As a result, a soluble anode cannot be used. When an insoluble anode is used, the insoluble anode produces an oxygen gas in the vicinity thereof, and part of the produced oxygen gas is dissolved into the plating solution Q, thus increasing a concentration of dissolved oxygen. The increased concentration of dissolved oxygen tends to cause oxidative decomposition of the additives. Therefore, the diaphragm 80 in the form of an ion exchange membrane or a neutral membrane is desirably disposed in covering relation to the surface of the insoluble anode 52 in order to prevent the components of the additives near the substrate W from being adversely affected and in order to prevent the additives denatured near the anode from reaching the substrate even if the components of the additives are subject to oxidative decomposition in the vicinity of the insoluble anode 52.

It is also desirable to form bubbles (or aerate) in the plating solution Q in the vicinity of the insoluble anode 52 with air or nitrogen supplied via, e.g., an aeration tube, not shown, for preventing the concentration of dissolved oxygen from unduly rising on the insoluble anode side.

Since the surface of the insoluble anode 52 held by the anode holder 58 is covered with the diaphragm 80 and the insoluble anode 52 is disposed such that the diaphragm 80 faces the substrate W that is held by the substrate holder 10 and disposed in the plating bath 51, it is possible to prevent an oxygen gas from being produced in the vicinity of the insoluble anode 52 and dissolving into the plating solution when the plating solution Q is bubbling (or subjected to the aeration) and hence to prevent an increase in the concentration of dissolved oxygen in the plating solution Q.

The electroplating apparatus 50 operates to plate the substrate W as follows. The substrate holder 10, which is holding the substrate W whose front and back surfaces are exposed, is placed in the plating solution Q in the plating bath 51 such that one of the surfaces of the substrate W, e.g., the front surface thereof, faces one of the insoluble anodes 52 which are immersed in the plating solution Q and the other surface of the substrate W, e.g., the back surface thereof, faces the other insoluble anode 52.

The plating power supply 53 supplies plating currents that are controlled by the controller 59 respectively between the front surface of the substrate W and the insoluble anode 52 which faces the front surface of the substrate W and between the back surface of the substrate W and the insoluble anode 52 which faces the back surface of the substrate W to thereby simultaneously plate the front surface and the back surface of the substrate W. If necessary, when the front surface and the back surface of the substrate W are plated, the paddles 62, each of which is arranged between the substrate W and each regulation plate 60, oscillate parallel to the substrate W to agitate the plating solution Q. As a result, metal films 106*a*, 106*b*, and 106*c* are grown on the surface of the substrate W including inner surface of the through-hole 100*a* defined in the substrate W.

A copper plating solution, including a base solution and chlorine, is used as the plating solution Q. The base solution is composed of copper sulfate and sulfuric acid. The additives, which are added to the copper plating solution, include an accelerator of ionic compound, a suppressor of aryl ether based high molecule, and a leveler of nitride high molecule. In an embodiment, a concentration of the copper sulfate is in a range of 200 g/L to 245 g/L, a concentration of sulfuric acid is in a range of 50 g/L to 120 g/L, and a concentration of the chlorine is in a range of 40 mg/L to 100 mg/L. A concentration of the accelerator is in a range of 0.5 mL/L to 1.5 mL/L, a concentration of the suppressor is in a range of 1.0 mL/L to 5.0 mL/L, and a concentration of the leveler is in a range of 1.0 mL/L to 3.0 mL/L. In some cases, an additive for the pulsed current may be additionally used. The additives, which are commercially available, have various characteristics and various concentrations of their components. Accordingly, it is noted that the concentrations of the additives are not limited to the above described ranges. While the plating solution used in this embodiment contains the three types of additives added thereto, two types of additives, which are the accelerator and the leveler, may be added to the plating solution. In the case of using the additive for the pulsed current, four types of additives may be added to the plating solution.

The electroplating method according to the embodiment of the present invention is performed using the electroplating apparatus shown in FIG. 2. The plating power supply 53 supplies the plating currents which have been controlled by the controller 59. The controlled plating currents flow between the front surface of the substrate W and the insoluble anode 52 that faces the front surface of the substrate W and between the back surface of the substrate W and the insoluble anode 52 that faces the back surface of the substrate W, thereby simultaneously plating the front surface and the back surface of the substrate W. This plating process is divided into three processes: a first plating process; a second plating process; and a third plating process, which are performed successively. The first plating process, the second plating process, and the third plating process will be described below.

In the following embodiment, a PR pulsed current is used as the plating current. This PR pulsed current is a pulsed current constituted by a forward current for metal (copper) deposition with use of the substrate W as a cathode and the insoluble anode 52 as an anode, and a reverse current for metal (copper) dissolution with use of the substrate W as an anode and the insoluble anode 52 as a cathode. The forward current and the reverse current are generated alternately. The first plating process, the second plating process, and the third plating process are performed using the PR pulsed current. A waveform of the plating current (the PR pulsed current) supplied between the back surface of the substrate W and one of the insoluble anode 52 is synchronized with a waveform of the plating current (the PR pulsed current) supplied between the front surface of the substrate W and the other insoluble anode 52. However, it is not necessary to synchronize these waveforms of the plating currents. For example, the waveforms may be shifted from each other by 90 degrees or 180 degrees.

Figure 17:
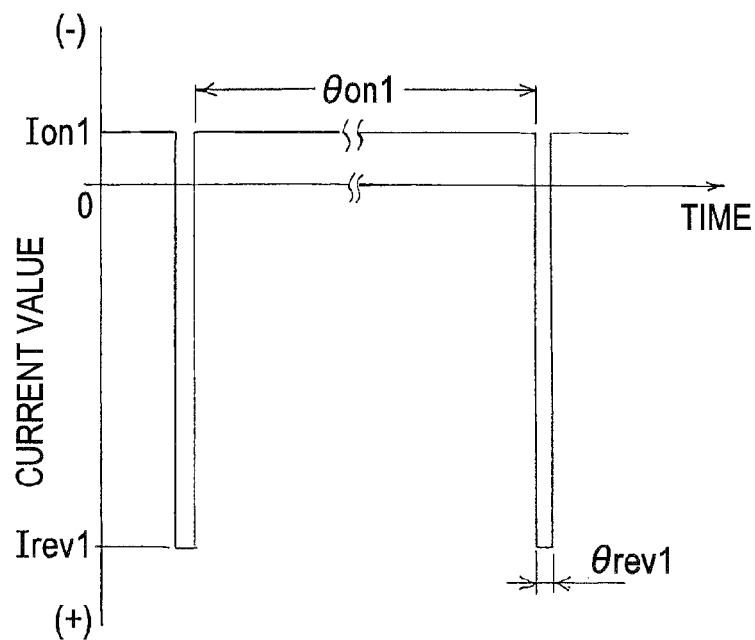
FIG. 17 is a diagram showing PR pulsed current used in a first plating process.
Figure 18:
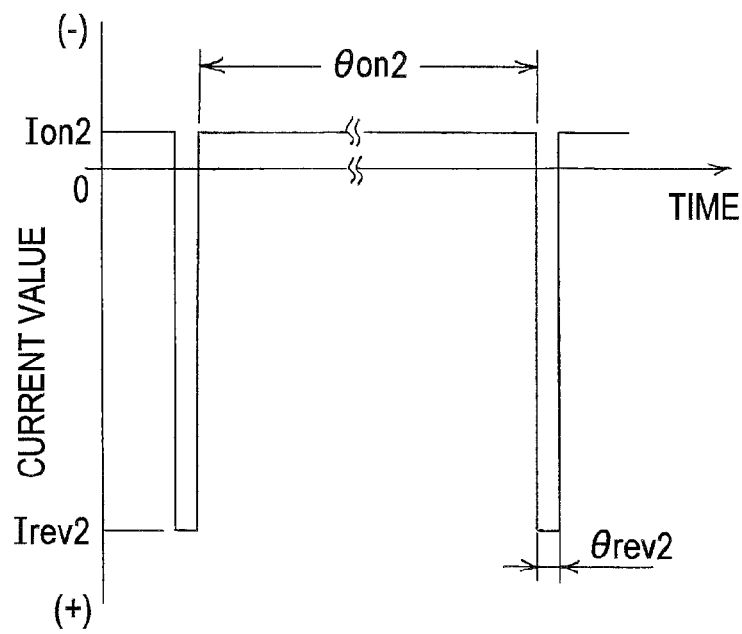
FIG. 18 is a diagram showing PR pulsed current used in a second plating process.
Figure 19:
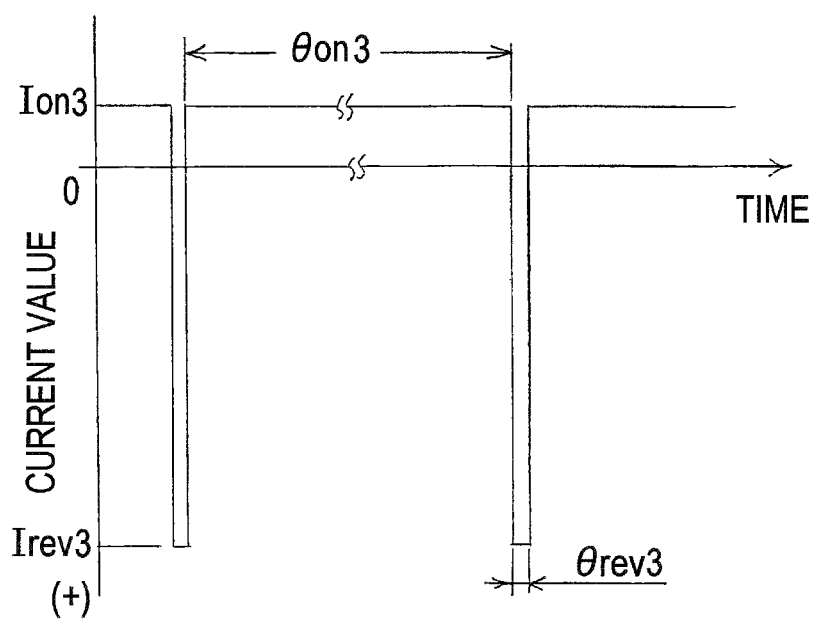
FIG. 19 is a diagram showing PR pulsed current used in a third plating process.
Figure 20A:
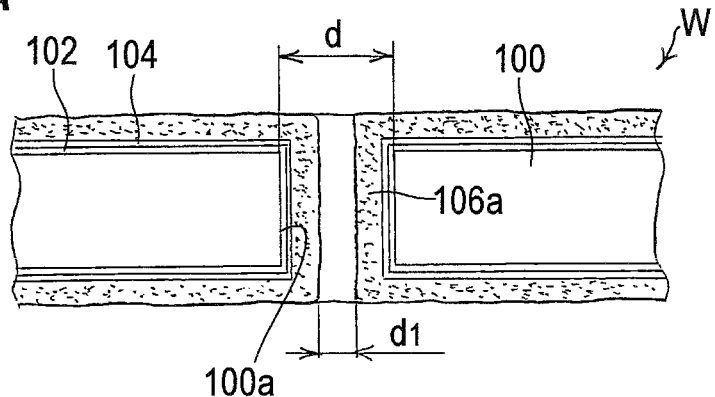
FIGS. 20A through 20C are diagrams illustrating an electroplating method in which the first plating process, the second plating process, and the third plating process are successively performed on a front surface and a back surface of the substrate to fill a through-hole with a metal film in a stepwise fashion.
Figure 20B:
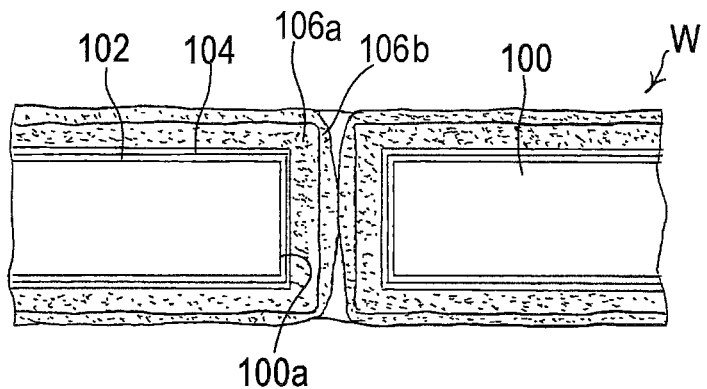
Figure 20C:
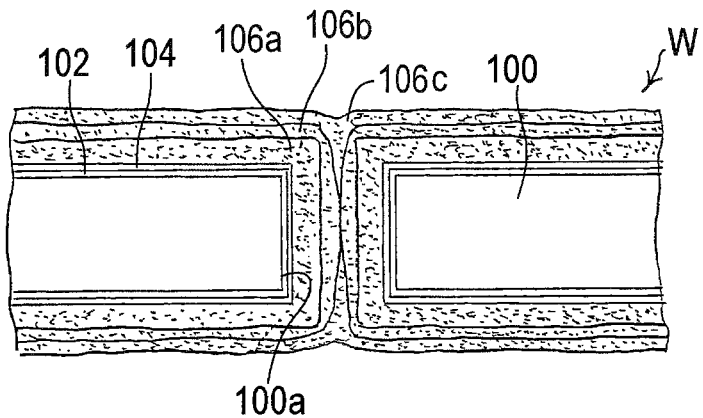

FIG. 17 shows the PR pulsed current that is used in the first plating process, FIG. 18 shows the PR pulsed current that is used in the second plating process, and FIG. 19 shows the PR pulsed current that is used in the third plating process. FIGS. 20A through 20C show steps of forming metal films 106*a*, 106*b*, and 106*c*. Specifically, an entire surface of a base material 100, including the inner circumferential surface of the vertically extending through-hole 100*a*, is covered with a barrier layer 102 of Ti or the like and a seed layer 104 serving as an electric feeding layer. In this state, the first plating process, the second plating process, and the third plating process are performed successively on both surfaces of the substrate W to fill the through-hole 100a with the metal films 106a, 106b, and 106c. The metal films 106a, 106b, and 106c are also formed in a field area of the substrate W by the first plating process, the second plating process, and the third plating process.

In one embodiment, a diameter d of the through-hole 100a formed in the substrate W is 175 μm, and a thickness of the substrate W is 300 μm. The copper plating solution used in this embodiment includes a basic solution and additives added to the basic solution. The basic solution in this embodiment is composed of copper sulfate pentahydrate having a concentration of 200 g/L, sulfuric acid having a concentration of 50 g/L, and chlorine having a concentration of 40 mg/L. The additives in this embodiment include the accelerator having a concentration of 1 mL/L, the suppressor having a concentration of 5 mL/L, and the leveler having a concentration of 10 mL/L.

As shown in FIG. 17, the first plating process uses the PR pulsed current constituted by the forward current with a value of Ion1 and the reverse current with a value of Irev1, which are alternately generated. In the following description, the value Ion1 will be referred to as a forward-current value Ion1, and the value Irev1 will be referred to as a reverse-current value Irev1. The forward-current value Ion1 is sustained for a forward-current duration θon1, and the reverse-current value Irev1 is sustained for a reverse-current duration θrev1. The forward-current value Ion1 in the first plating process is larger than a forward-current value Ion2 which is used in the second plating process as described later (Ion1>Ion2). With use of such forward-current value Ion1, the first plating process serves as a conformal plating process which forms a metal film with a small throwing power (i.e., a ratio of a thickness of the metal film in the through-hole to a thickness of the metal film in the field area). By using the PR pulsed current having the forward-current value Ion1 that is larger than the forward-current value Ion2, the throwing power decreases in the first plating process. For example, it is possible to perform the conformal plating process that can achieve the throwing power of 1 (i.e., the ratio of the thickness of the metal film in the through-hole to the thickness of the metal film in the field area is 1). The conformal plating process is defined as a plating process of forming a metal film on a target surface with a uniform thickness over the target surface in its entirety.

As shown in FIG. 20A, the surface of the seed layer 104 in its entirety, including a surface thereof in the through-hole 100a, is covered with the metal film 106a with a uniform thickness. This metal film 106a formed on the surface of the seed layer 104 in the through-hole 100a serves to reduce a substantial diameter d1 of the through-hole 100a down to a range of 5 μm to 10 μm, for example. In this manner, the first plating process is performed to form the metal film 106a with a uniform thickness on the entire surface of the seed layer 104, including the surface thereof in the through-hole 100a, without blocking up the central portion of the through-hole 100a with respect to the depth direction (i.e., the longitudinal direction) thereof. As a result, the diameter of the through-hole 100a is substantially reduced and a time required for the metal film to fill up the through-hole 100a can be shortened.

The use of the PR pulsed current in the first plating process makes it possible to form the metal film 106a with a more uniform thickness in the through-hole 100a including the opening portions thereof, as compared with a case where the first plating process is performed with use of a direct current which equalizes a deposition speed (or deposition rate) of the metal. If the direct current is used in the first plating process, the metal film is formed with a greater thickness on the opening portions selectively than on the central portion of the through-hole 100a, resulting in a smaller diameter at the opening portions than a diameter at the central portion of the through-hole 100a. This profile is not suitable for filling the through-hole with the metal film. However, in the case of using the direct current with a small current density, it is possible to plate the target surface with the metal film having a uniform thickness. Therefore, in such a case, the direct current may be used.

With use of the PR pulsed current in the first plating process, it is also possible to form the metal film with a greater thickness in the interior than on the opening portions of the through-hole, depending on the forward-current value (or current density) Ion1.

As shown in FIG. 18, the second plating process uses a PR pulsed current constituted by a forward current with a value of Ion2 and a reverse current with a value of Irev2, which are generated alternately. In the following description, the value Ion2 will be referred to as a forward-current value Ion2, and the value Irev2 will be referred to as a reverse-current value Irev2. The forward-current value Ion2 is sustained for a forward-current duration θon2, and the reverse-current value Irev2 is sustained for a reverse-current duration θrev2. The forward-current value Ion2 in the second plating process is smaller than forward-current value Ion1 which is used in the first plating process (Ion2<Ion1). With use of such forward-current value Ion2 in second plating process, the throwing power increases. As a result, the metal film formed in the through-hole 100a becomes thicker than in the field area of the substrate W. In particular, in the case where the through-hole 100a has a small diameter (e.g., φ30 μm to φ100 μm), if the forward-current value Ion2 is large, the opening portions of the through-hole 100a may often be blocked up. Therefore, it is preferable that the forward-current value Ion2 be sufficiently small and that a ratio of the reverse-current value Irev2 to the forward-current value Ion2 (Irev2/Ion2) be larger than 15 and smaller than 50.

As shown in FIG. 20B, the second plating process is performed with the increased throwing power to form the metal film 106b on the metal film 106a, which has been formed in the first plating process, such that a part of the metal film 106b rises at the central portion of the through-hole 100a to block up the central portion of the through-hole 100a (i.e., perform center-up filling of the through-hole 100a).

In this manner, the first plating process (i.e., the conformal plating process which forms the metal film 106a with a uniform thickness in the through-hole 100a) is performed to reduce the substantial diameter of the through-hole 100a, and then the second plating process is performed with the increased throwing power to close the central portion of the through-hole 100a with the metal film 106b. According to this embodiment, it is possible to close up the central portion of the through-hole 100a with the metal film in a shorter period of time than in a case where a plating process is performed with an increased throwing power from the beginning until the central portion of the through-hole 100a is closed.

As shown in FIG. 19, the third plating process uses a PR pulsed current constituted by a forward current with a value of Ion3 and a reverse current with a value of Irev3, which are generated alternately. In the following description, the value Ion3 will be referred to as a forward-current value Ion3, and the value Irev3 will be referred to as a reverse-current value Irev3. The forward-current value Ion3 is sustained for a forward-current duration θon3, and the reverse-current value Irev3 is sustained for a reverse-current duration θrev3. The forward-current value Ion3 in the third plating process is equal to or larger than the forward-current value Ion2 which is used in the second plating process (Ion3≥Ion2), so long as no void is formed in the metal film 106c in the third plating process. In the case where the through-hole 100a has a small diameter (e.g., φ30 μm to φ100 μm), the third plating process is performed with the reverse-current value Irev3 smaller than the reverse-current value Irev2 used in the second plating process (Irev3<Irev2) while the forward-current value Ion3 is equal to the forward-current value Ion2 used in the second plating process.

In this third plating process, as shown in FIG. 20C, the metal film 106c grows in a bottom-up manner from the surface of the metal film 106b that has been formed in the second plating process until the through-hole 100a is completely filled up with the metal film 106c, whereby filling of the through-hole 100a is completed. The third plating process may use direct current, instead of the PR pulsed current.

In this embodiment, a ratio of the forward-current value Ion1 to the reverse-current value Irev1 of the PR pulsed current used in the first plating process is kept constant. This ratio may be changed as the plating of the substrate progresses. This manner of changing the ratio of the forward-current value to the reverse-current value can also be applied to the PR pulsed current used in the second plating process and the PR pulsed current used in the third plating process as well.

Figure 21:
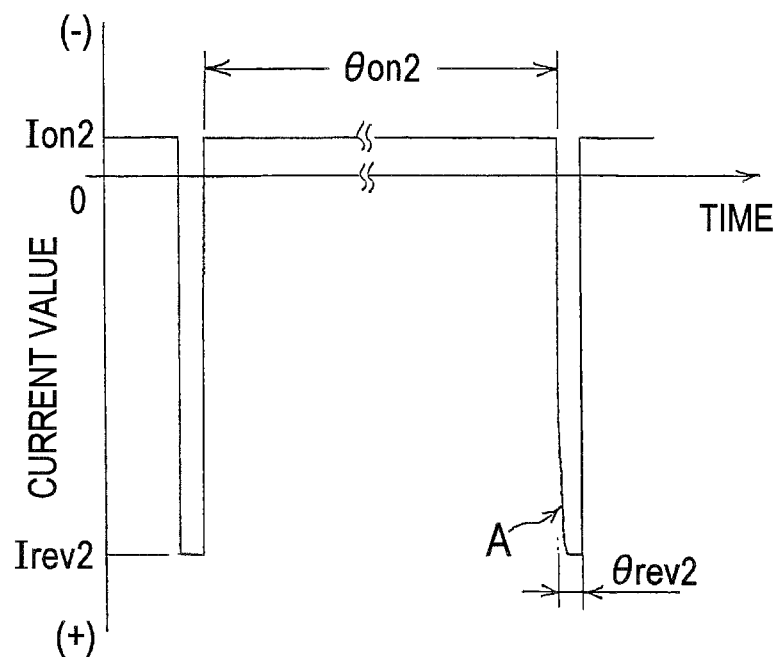
FIG. 21 is a diagram showing the PR pulsed current including a reverse current with a dull portion.

The reverse-current duration θrev2 of the PR pulsed current used in the second plating process is preferably longer than the reverse-current duration θrev1 of the PR pulsed current used in the first plating process (θrev2>θrev1). With this time setting, it is possible to prevent the void from being formed in the metal film 106b in the second plating process. This is because of the following reasons. When the current is supplied separately to the front surface and the back surface of the substrate W through electric contacts, a dull portion A may occur in the reverse current of the PR pulsed current used in the second plating process due to influences of the power supply or the wires, as shown in FIG. 21. Occurrence of such a dull portion A in the reverse current of the PR pulsed current results in a difference in the waveform (i.e., shape) between the PR pulsed current supplied to the front surface and the PR pulsed current supplied to the back surface of the substrate W. The difference in the waveform of the PR pulsed current produces in turn a difference in the growth of the metal film between the front surface and the back surface of the substrate W. As a result, the void is likely to be formed in the metal film.

Thus, in order to prevent the formation of the void, the reverse-current duration θrev2 of the PR pulsed current used in the second plating process is set to be longer than the reverse-current duration θrev1 of the PR pulsed current used in the first plating process (θrev2>θrev 1). This relationship of the current duration can relatively reduce the effect of the dull portion, and can therefore prevent the formation of the void in the metal film even if the dull portion appears on the waveform of the PR pulsed current.

Figure 22:
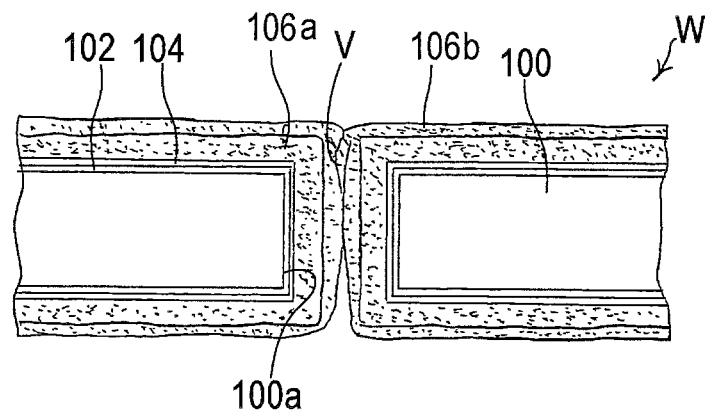
FIG. 22 is a diagram showing a state in which opening portions of the through-hole are blocked up with the metal film and a void is formed in the metal film.

If the reverse-current duration θrev2 of the PR pulsed current used in the second plating process is too long, the throwing power does not increase. As a result, the metal film 106b at the opening portions of the through-hole 100a becomes thick before the central portion of the through-hole 100a with respect to the depth direction (longitudinal direction) thereof is blocked up with the metal film 106b formed in the second plating process. As a consequence, as shown in FIG. 22, the opening portions of the through-hole 100a are closed by the metal film 106b and a void V is formed in the metal film 106b.

Thus, the reverse-current duration θrev2 of the PR pulsed current used in the second plating process is preferably longer than 0.5 milliseconds and shorter than 10 milliseconds (i.e., 0.5 msec<θrev2<10 msec). In particular, if the through-hole 100a has a large diameter (e.g., φ150 μm to φ300 μm), it is preferable that the reverse-current duration θrev2 be longer than 3 milliseconds and shorter than 5 milliseconds (3 msec<θrev2<5 msec). If the through-hole 100a has a small diameter (e.g., φ30 μm to φ100 μm), it is preferable that the reverse-current duration θrev2 be longer than 0.5 milliseconds and shorter than 3 milliseconds (0.5 msec<θrev2<3 msec).

Even if the difference in the waveform (i.e., the shape) exists between the PR pulsed current supplied to the front surface and the PR pulsed current supplied to the back surface of the substrate W, the growth of the metal film 106b by plating is not affected greatly until the central portion of the through-hole 100a is blocked up with the metal film 106b.

If a ratio of the forward-current duration θon2 to the reverse-current duration θrev2 of the PR pulsed current used in the second plating process (i.e., θon2/θrev2) is at most 75 (i.e., θon2/θrev2≤75), the metal film formed on a salient in the field area of the substrate W grows excessively. As a result, irregularities in the field area of the substrate W are exaggerated and a uniformity of a local film thickness in the field area is lowered. On the other hand, if the ratio of the forward-current duration θon2 to the reverse-current duration θrev2 of the PR pulsed current used in the second plating process (i.e., θon2/θrev2) is at least 120 (i.e., θon2/θrev2≥120), the void tends to be formed in the metal film 106b in the second plating process.

Thus, in order to block up the central portion of the through-hole 100a with the metal film 106b in the second plating process without forming the void in the metal film 106b, the ratio of the forward-current duration θon2 to the reverse-current duration θrev2 of the PR pulsed current used in the second plating process (i.e., θon2/θrev2) is preferably larger than 75 and smaller than 120 (i.e., 75<θon2/θrev2<120), and more preferably larger than 75 and smaller than 90 (i.e., 75<θon2/θrev2<90).

After the central portion of the through-hole 100a is blocked up by the metal film 106b formed in the second plating process, the third plating process is performed. In this third plating process, it is necessary to completely fill the through-hole 100a with the metal film 106c to complete filling of the through-hole 100a. When the third plating process is performed, the forward-current value Ion3 of the PR pulsed current is increased near a value at which the void is formed in the metal film 106c, so that a time required for filling the through-hole 100a with the metal film can be shortened. On the other hand, as the forward-current value Ion3 increases, the bottom-up growth does not progress.

With use of the increased reverse-current value Irev3, the metal film 106c can grow in a bottom-up manner from the surface of the metal film 106b, even if the forward-current value Ion3 is the same. Therefore, the time required to fill the through-hole 100a with the metal film can be shortened. However, if a ratio of the reverse-current value Irev3 to the forward-current value Ion3 of the PR pulsed current used in the third plating process (i.e., Irev3/Ion3) is at most 4 (i.e., Irev3/Ion3≤4), the bottom-up growth does not progress and the void may be finally formed in the metal film. On the other hand, if the ratio of the reverse-current value Irev3 to the forward-current value Ion3 of the PR pulsed current used in the third plating process (i.e., Irev3/Ion3) is at least 50 (i.e., Irev3/Ion3≥50), a voltage increases due to the increase in the reverse-current value Irev3, thus greatly changing characteristics of the additives.

Thus, if the through-hole 100a has a large diameter (e.g., φ150 μm to φ300 μm), the ratio of the reverse-current value Irev3 to the forward-current value Ion3 (i.e., Irev3/Ion3) is preferably larger than 4 and smaller than 15 (i.e., 4<Irev3/Ion3<15), and more preferably larger than 8 and smaller than 12 (i.e., 8<Irev3/Ion3<12). If the through-hole 100a has a small diameter (e.g., φ30 μm to φ100 μm), the ratio of the reverse-current value Irev3 to the forward-current value Ion3 (i.e., Irev3/Ion3) is preferably larger than 15 and smaller than 50 (i.e., 15<Irev3/Ion3<50).

The leveler is used for increasing the metal deposition speed in the through-hole, rather than in the field area of the substrate. The more vigorous the paddle 62 agitates the plating solution, the more effective the leveler suppresses the metal deposition. For this reason, it is important to agitate the plating solution during plating of the substrate. Specifically, it is necessary to agitate the plating solution vigorously in order to suppress the metal deposition in the field area of the substrate. The more vigorous the paddle 62 agitates the plating solution, the more the metal deposition is suppressed in the field area of the substrate and the more the metal deposition is accelerated in the through-hole of the substrate.

In this embodiment, the paddles 62, each arranged between the substrate W and each regulation plate 60, are configured to oscillate parallel to the substrate W to agitate the plating solution Q. A linear velocity of the paddles 62 reaches its maximum when the paddles 62 pass over the center of the substrate W. The maximum of the linear velocity of the paddles 62 at this time is preferably in a range of 1.3 m/sec to 2.6 m/sec, and more preferably in a range of 2.0 m/sec to 2.2 m/sec. A distance between the substrate W and each paddle 62 is preferably in a range of 5 mm to 11 mm. It is preferable to change the linear velocity of the paddles 62 according to the first plating process, the second plating process, and the third plating process such that a relationship of P1<P2≤P3 holds, where P1 is the linear velocity of the paddles 62 in the first plating process, P2 is the linear velocity of the paddles 62 in the second plating process, and P3 is the linear velocity of the paddles 62 in the third plating process.

Examples of the method of agitating the plating solution includes, other than the method of using the paddles, a method in which the plating solution is ejected at a high speed toward the front surface and the back surface of the substrate, and a method in which propellers are rotated at a high speed near the front surface and the back surface of the substrate.

The present invention is not limited to the through-hole formed in a printed substrate. For example, the through-hole may be formed in a silicon wafer (silicon substrate). The substrate may have any thickness, while a typical substrate has a thickness in a range of 150 μm to 500 μm. The through-hole may have any diameter (bore), while a typical through-hole has a diameter in a range of 100 μm to 300 μm. The through-hole may have a tapered cross section with a small diameter or a large diameter at its central portion, while a typical through-hole has a straight cross section. In particular, the tapered through-hole whose diameter at the central portion is smaller than a diameter at the opening portions may be preferable because the central portion of the through-hole is blocked up with the metal film in a short period of time and therefore a plating time required to complete the filling of the through-hole can be shortened.

When the reverse current of the PR pulsed current is passed to the substrate, electric charge may be consumed in dissolving a capacitance which exists due to the wires, the substrate holder, or the plating bath and as a result the reverse current may not reach a value at which the metal on the substrate surface is dissolved. Thus, it is preferable to plate the substrate while measuring a voltage between the anode and the cathode (the substrate) and increase the duration of the reverse current long enough for the reverse current to contribute to dissolving the metal on the substrate surface.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims and equivalents.

What is claimed is:

1. An electroplating method for a through-hole, the method comprising:
   immersing a substrate having a through-hole into a plating solution; and
   supplying a plating current between the substrate and anodes to perform a first plating process, a second plating process, and a third plating process successively, the anodes being arranged so as to face a front surface and a back surface of the substrate,
   wherein the first plating process is a plating process of forming a metal film with a uniform thickness in the through-hole to reduce a diameter of the through-hole, the plating current used in the first plating process being a PR pulsed current constituted by a forward current used in metal deposition and a reverse current used in metal dissolution which are generated alternately,
   the second plating process is a plating process of blocking up a central portion of the through-hole with the metal film using a PR pulsed current constituted by a forward current used in metal deposition and a reverse current used in metal dissolution which are generated alternately, a forward-current value of the PR pulsed current in the second plating process is smaller than a value of the forward current used in metal deposition in the first plating process, and
   the third plating process is a plating process of completely filling the through-hole with the metal film using a plating current whose value is larger than the forward-current value of the PR pulsed current used in the second plating process.

2. The method according to claim 1, wherein a reverse-current duration of the PR pulsed current used in the second plating process is longer than a reverse-current duration of the PR pulsed current used in the first plating process.

3. The method according to claim 1, wherein:
   the plating current used in the third plating process is a PR pulsed current constituted by a forward current used in metal deposition and a reverse current used in metal dissolution which are generated alternately; and
   a forward-current value of the PR pulsed current used in the third plating process is larger than the forward-current value of the PR pulsed current used in the second plating process.

4. The method according to claim 1 wherein a ratio of a forward-current duration to a reverse-current duration of the PR pulsed current used in the second plating process is larger than 75 and smaller than 120.

5. The method according to claim 1 wherein a reverse-current duration of the PR pulsed current used in the second plating process is longer than 0.5 milliseconds and shorter than 10 milliseconds.

6. The method according to claim 1 wherein if the through-hole has a diameter in a range of 30 μm to 100 μm, the second plating process is performed using the PR pulsed current whose ratio of a reverse-current value to the forward-current value is larger than 15 and smaller than 50.

7. The method according to claim 1, wherein:
the plating current used in the third plating process is a PR pulsed current constituted by a forward current used in metal deposition and a reverse current used in metal dissolution which are generated alternately; and
a ratio of a reverse-current value to a forward-current value of the PR pulsed current used in the third plating process is larger than 4 and smaller than 15.

8. The method according to claim 1, wherein:
the plating current used in the third plating process is a PR pulsed current constituted by a forward current used in metal deposition and a reverse current used in metal dissolution which are generated alternately; and
a ratio of a reverse-current value to a forward-current value of the PR pulsed current used in the third plating process is larger than 15 and smaller than 50.

9. The method according to claim 3, wherein a reverse-current value of a PR pulsed current used in the third plating process is smaller than the reverse-current value of the PR pulsed current used in the second plating process.

10. The method according to claim 1, further comprising:
during the first plating process, the second plating process, and the third plating process, agitating the plating solution by oscillating paddles at a maximum linear velocity in a range of 1.3 m/sec to 2.6 m/sec, one of the paddles being arranged between the substrate and one of the anodes and the other of the paddles being arranged between the substrate and the other of the anodes.

11. An electroplating apparatus for a through-hole, the apparatus comprising:
a plating bath configured to store a plating solution therein;
a substrate holder configured to hold a substrate having a through-hole with a front surface and a back surface of the substrate exposed and configured to immerse the substrate into the plating solution in the plating bath;
a pair of anodes disposed so as to face the front surface and the back surface of the substrate immersed in the plating solution;
a plating power supply capable of changing a flow direction of a plating current and changing a value of the plating current and configured to supply the plating current between the substrate and the anodes; and
a controller configured to control the plating power supply so as to perform a first plating process, a second plating process, and a third plating process successively,
the first plating process being a plating process of forming a metal film with a uniform thickness in the through-hole to reduce a diameter of the through-hole, the plating current used in the first plating process being a PR pulsed current constituted by a forward current used in metal deposition and a reverse current used in metal dissolution which are generated alternately,
the second plating process being a plating process of blocking up a central portion of the through-hole with the metal film using a PR pulsed current constituted by a forward current used in metal deposition and a reverse current used in metal dissolution which are generated alternately, a forward-current value of the PR pulsed current in the second plating process being smaller than a value of the forward current used in metal deposition in the first plating process, and
the third plating process being a plating process of completely filling the through-hole with the metal film using a plating current whose value is larger than the forward-current value of the PR pulsed current used in the second plating process.

* * * * *